(12) United States Patent
Ishii et al.

(10) Patent No.: US 11,588,291 B2
(45) Date of Patent: Feb. 21, 2023

(54) LASER CHAMBER APPARATUS, GAS LASER APPARATUS, AND METHOD FOR MANUFACTURING ELECTRONIC DEVICE

(71) Applicant: Gigaphoton Inc., Tochigi (JP)

(72) Inventors: Takuya Ishii, Oyama (JP); Takashi Ito, Oyama (JP); Ryota Kujira, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/372,210

(22) Filed: Jul. 9, 2021

(65) Prior Publication Data
US 2021/0336404 A1    Oct. 28, 2021

Related U.S. Application Data

(63) Continuation of application No. PCT/JP2019/007263, filed on Feb. 26, 2019.

(51) Int. Cl.
*G03F 7/20* (2006.01)
*H01S 3/038* (2006.01)
(Continued)

(52) U.S. Cl.
CPC ........ *H01S 3/0388* (2013.01); *G03F 7/70025* (2013.01); *H01S 3/034* (2013.01); *H01S 3/2251* (2013.01)

(58) Field of Classification Search
CPC ...... H01S 3/0388; H01S 3/038; H01S 3/0384; H01S 3/09713; H01S 3/034;
(Continued)

(56) References Cited

U.S. PATENT DOCUMENTS 5,347,531 A    9/1994 Nakatani et al.
8,712,302 B2   4/2014 Nakamura et al.
(Continued)

FOREIGN PATENT DOCUMENTS

JP    S56-131042 U    10/1981
JP    2000-286622 A   10/2000
JP    2015-018910 A    1/2015

OTHER PUBLICATIONS

International Search Report issued in PCT/JP2019/007263; dated May 21, 2019.
(Continued)

*Primary Examiner* — Mesfin T Asfaw
(74) *Attorney, Agent, or Firm* — Studebaker & Brackett PC

(57) ABSTRACT

A laser chamber apparatus may include a pipe, an inner electrode extending along a longitudinal direction of the pipe and disposed in a through hole in the pipe, an outer electrode including a contact plate extending along the longitudinal direction of the pipe and being in contact with an outer circumferential surface of the pipe and a ladder section formed of bar members each having one end connected to the contact plate and juxtaposed along a longitudinal direction of the contact plate, and a leaf spring extending along the longitudinal direction of the pipe and configured to press the outer electrode against the pipe. The leaf spring may include leaf spring pieces separated by slits, and the leaf spring pieces may each include a bent section bent along the edge and are configured to press the bar members in a position shifted from the bent sections toward the edge.

29 Claims, 11 Drawing Sheets

(51) Int. Cl.
*H01S 3/034* (2006.01)
*H01S 3/225* (2006.01)

(58) Field of Classification Search
CPC .... H01S 3/2251; H01S 3/10084; H01S 3/036;
H01S 3/08009; H01S 3/0971; H01S 3/03;
H01S 3/0385; H01S 3/08004; H01S
3/09702; H01S 3/134; H01S 3/104; G03F
7/70025; G03F 7/70575
See application file for complete search history.

(56) References Cited

U.S. PATENT DOCUMENTS

| | | |
|---|---|---|
| 9,748,727 B2 | 8/2017 | Kakizaki et al. |
| 2016/0172817 A1 | 6/2016 | Kakizaki et al. |

OTHER PUBLICATIONS

Written Opinion issued in PCT/JP2019/007263; dated May 21, 2019.
An Office Action mailed by the Japanese Patent Office dated Nov. 8, 2022, which corresponds to Japanese Patent Application No. 2021-501423 and is related to U.S. Appl. No. 17/372,210; with English language translation.

LASER CHAMBER APPARATUS, GAS LASER APPARATUS, AND METHOD FOR MANUFACTURING ELECTRONIC DEVICE

CROSS-REFERENCE TO RELATED APPLICATIONS

The present application is a continuation application of International Application No. PCT/JP2019/007263, filed on Feb. 26, 2019, the entire contents of which are hereby incorporated by reference.

BACKGROUND

1. Technical Field

The present disclosure relates to a laser chamber apparatus, a gas laser apparatus, and a method for manufacturing an electronic device.

2. Related Art

In recent years, a semiconductor exposure apparatus (hereinafter referred to as "exposure apparatus") is required to improve the resolution thereof as a semiconductor integrated circuit is increasingly miniaturized and highly integrated. To this end, reduction in the wavelength of the light outputted from a light source for exposure is underway. A gas laser apparatus is typically used as the light source for exposure in place of a mercury lamp in related art. For example, a KrF excimer laser apparatus, which outputs ultraviolet laser light having a wavelength of 248 nm, and an ArF excimer laser apparatus, which outputs ultraviolet laser light having a wavelength of 193 nm, are used as the gas laser apparatus for exposure.

As a next-generation exposure technology, liquid-immersion exposure, in which the gap between an exposure lens of the exposure apparatus and a wafer is filled with a liquid, has been put into use. In the liquid-immersion exposure, since the refractive index of the gap between the exposure lens and the wafer changes, the apparent wavelength of the light from the light source for exposure shortens. When the liquid-immersion exposure is performed with an ArF excimer laser apparatus used as the light source for exposure, the wafer is irradiated with ultraviolet light having an in-water wavelength of 134 nm. The technology is called ArF liquid-immersion exposure or ArF liquid-immersion lithography.

KrF and ArF excimer laser apparatuses each have a wide linewidth ranging from about 350 to 400 pm in spontaneous oscillation. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element, such as an etalon and a grating, is provided in a laser resonator of the gas laser apparatus to narrow the spectral linewidth in some cases. A laser apparatus providing a narrowed spectral width is hereinafter referred to as a narrowed-line laser apparatus.

CITATION LIST

Patent Literature

[PTL 1] U.S. Pat. No. 9,748,727
[PTL 2] U.S. Pat. No. 8,712,302

SUMMARY

An aspect of the present disclosure relates to a laser chamber apparatus. The laser chamber apparatus may include a dielectric pipe, an inner electrode extending along a longitudinal direction of the pipe and disposed in a through hole in the pipe, an outer electrode including a contact plate extending along the longitudinal direction of the pipe and being in contact with an outer circumferential surface of the pipe and a ladder section formed of a plurality of bar members each having one end connected to the contact plate and juxtaposed along a longitudinal direction of the contact plate, and a leaf spring extending along the longitudinal direction of the pipe and configured to press the outer electrode against the pipe. The leaf spring may include a plurality of leaf spring pieces separated by slits resulting from cutting of the leaf spring from an edge thereof along the longitudinal direction of the pipe, and the leaf spring pieces may each include a bent section bent along the edge and are configured to press the bar members in a position shifted from the bent sections toward the edge.

Another aspect of the present disclosure relates to a gas laser apparatus comprising a laser chamber apparatus. The laser chamber apparatus may include a dielectric pipe, an inner electrode disposed in a through hole in the pipe, an outer electrode including a contact plate extending along a longitudinal direction of the pipe and being in contact with an outer circumferential surface of the pipe and a ladder section formed of a plurality of bar members each having one end connected to the contact plate and juxtaposed along a longitudinal direction of the contact plate, and a leaf spring extending along the longitudinal direction of the pipe and configured to press the outer electrode against the pipe. The leaf spring may include a plurality of leaf spring pieces separated by slits resulting from cutting of the leaf spring from an edge thereof along the longitudinal direction of the pipe, and the leaf spring pieces may each include a bent section bent along the edge and configured to press the bar members in a position shifted from the bent sections toward the edge.

Still another aspect of the present disclosure relates to a method for manufacturing an electronic device. The method may include generating laser light in a gas laser apparatus including a laser chamber apparatus, outputting the laser light to an exposure apparatus, and exposing a light sensitive substrate to the laser light in the exposure apparatus to manufacture the electronic device, the laser chamber apparatus including a dielectric pipe, an inner electrode disposed in a through hole in the pipe, an outer electrode including a contact plate extending along a longitudinal direction of the pipe and being in contact with an outer circumferential surface of the pipe and a ladder section formed of a plurality of bar members each having one end connected to the contact plate and juxtaposed along a longitudinal direction of the contact plate, and a leaf spring extending along the longitudinal direction of the pipe and configured to press the outer electrode against the pipe, the leaf spring including a plurality of leaf spring pieces separated by slits resulting from cutting of the leaf spring from an edge thereof along the longitudinal direction of the pipe, and the leaf spring pieces each including a bent section bent along the edge and configured to press the bar members in a position shifted from the bent section toward the edge.

BRIEF DESCRIPTION OF THE DRAWINGS

Embodiments of the present disclosure will be described below only by way of example with reference to the accompanying drawings.

DETAILED DESCRIPTION

Figure 1:
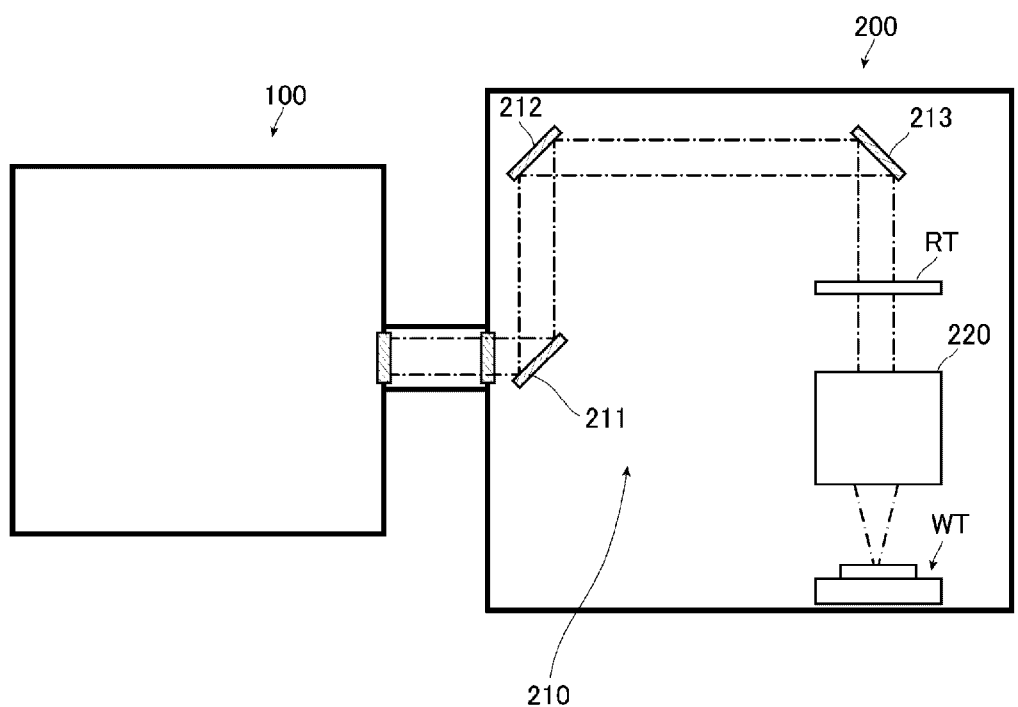
FIG. 1 is a diagrammatic view showing a schematic configuration example of an entire manufacturing apparatus used in an exposure step for manufacturing an electronic device.

1. Description of manufacturing apparatus used in electronic device exposure step
2. Description of gas laser apparatus in Comparative Example
2.1 Configuration
2.2 Operation
2.3 Problems
3. Description of chamber apparatus according to first embodiment
3.1 Configuration
3.2 Effects and advantages
4. Description of chamber apparatus according to second embodiment
4.1 Configuration
4.2 Effects and advantages
5. Description of chamber apparatus according to third embodiment
5.1 Configuration
5.2 Effects and advantages Embodiments of the present disclosure will be described below in detail with reference to the drawings.

The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Description of Manufacturing Apparatus Used in Electronic Device Exposure Step FIG. 1 is a diagrammatic view showing a schematic configuration example of an entire manufacturing apparatus used in an exposure step for manufacturing an electronic device. The manufacturing apparatus used in the exposure step includes a gas laser apparatus 100 and an exposure apparatus 200, as shown in FIG. 1. The exposure apparatus 200 includes an illumination optical system 210, which includes a plurality of mirrors 211, 212, and 213, and a projection optical system 220. The illumination optical system 210 is configured to illuminate a reticle pattern on a reticle stage RT with laser light having entered the exposure apparatus 200 from the gas laser apparatus 100. The projection optical system 220 is configured to perform reduction projection on the laser light having passed through the reticle to cause the laser light to be brought into focus on a workpiece that is not shown but is placed on a workpiece table WT. The workpiece is a light sensitive substrate onto which a photoresist has been applied, such as a semiconductor wafer. The exposure apparatus 200 is configured to translate the reticle stage RT and the workpiece table WT in synchronization with each other to expose the workpiece to the laser light having reflected the reticle pattern. A semiconductor device that is an electronic device can be manufactured by transferring a device pattern onto the semiconductor wafer in the exposure step described above.

2. Description of Gas Laser Apparatus in Comparative Example 2.1 Configuration

Figure 2:
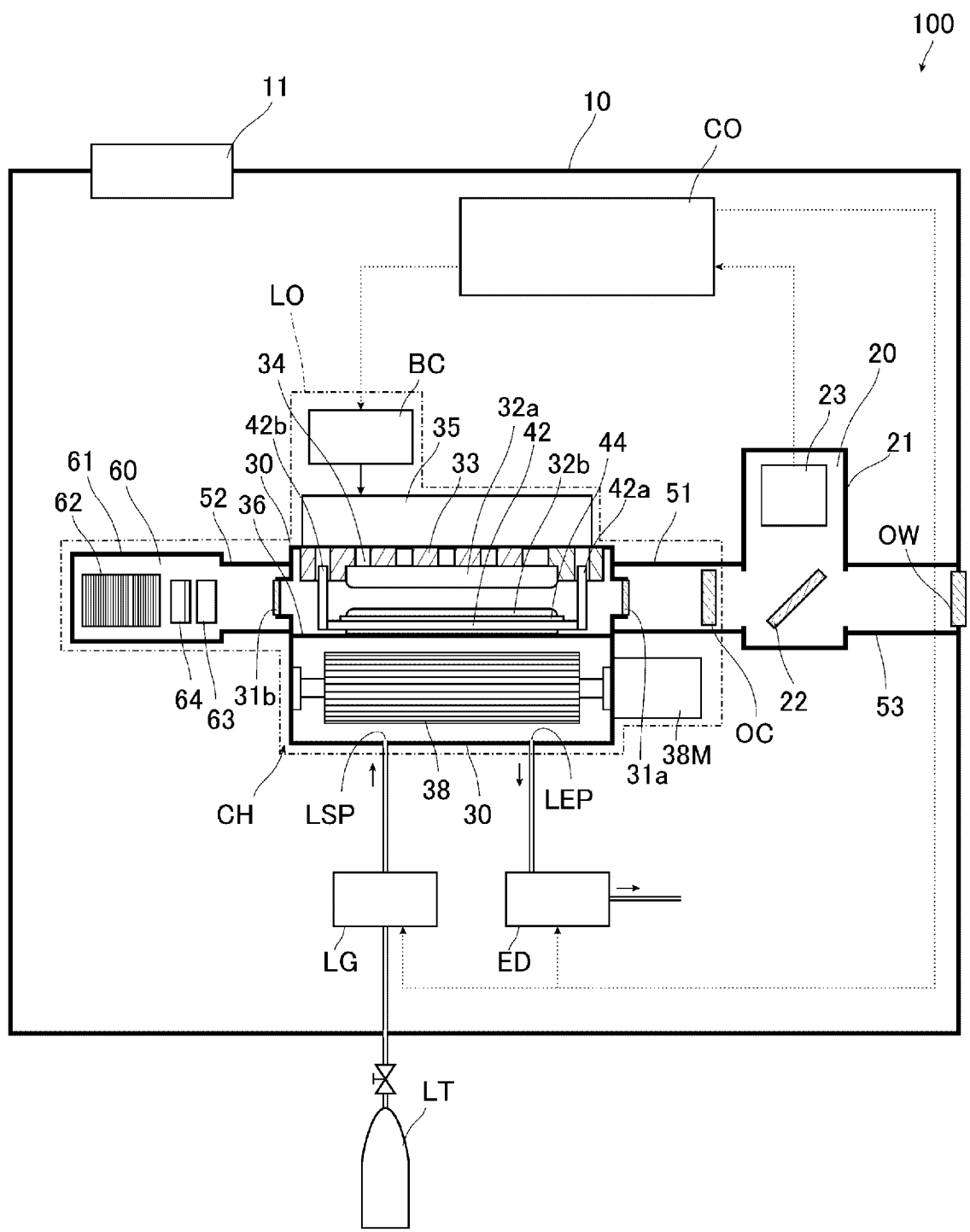
FIG. 2 is a diagrammatic view showing a schematic configuration example of an entire gas laser apparatus.

A gas laser apparatus in Comparative Example will be described. FIG. 2 is a diagrammatic view showing a schematic configuration example of the entire gas laser apparatus in Comparative Example. The gas laser apparatus 100 in Comparative Example includes an enclosure 10, a laser oscillator LO, an energy monitoring module 20, and a controller CO as primary components, as shown in FIG. 2. The gas laser apparatus 100 in Comparative Example is an ArF excimer laser apparatus using a mixed gas containing, for example, argon (Ar), fluorine (F), and neon (Ne). In this case, the gas laser apparatus 100 is configured to output pulsed laser light having a center wavelength of about 193 nm. The gas laser apparatus 100 may instead be a gas laser apparatus other than an ArF excimer laser apparatus, for example, a KrF excimer laser apparatus using a mixed gas containing krypton (Kr), fluorine (F), and neon (Ne). In this case, the gas laser apparatus 100 is configured to output pulsed laser light having a center wavelength of about 248 nm. A mixed gas containing Ar, $F_2$, and Ne, which are each a laser medium, and a mixed gas containing Kr, $F_2$, and Ne, which are each a laser medium, are each referred to as a laser gas in some cases.

The controller CO can be, for example, a microcontroller, an IC (integrated circuit), an LSI (large-scale integrated circuit), an ASIC (application specific integrated circuit), or any other integrated circuit or an NC (numerical control) apparatus. When an NC apparatus is used as the controller CO, the controller CO may or may not use a machine learning device. Some components of the gas laser apparatus are controlled by the controller CO, as will be described below.

The laser oscillator LO includes a chamber apparatus CH, a charger BC, a line narrowing module 60, and an output coupling mirror OC, as primary components.

Figure 3:
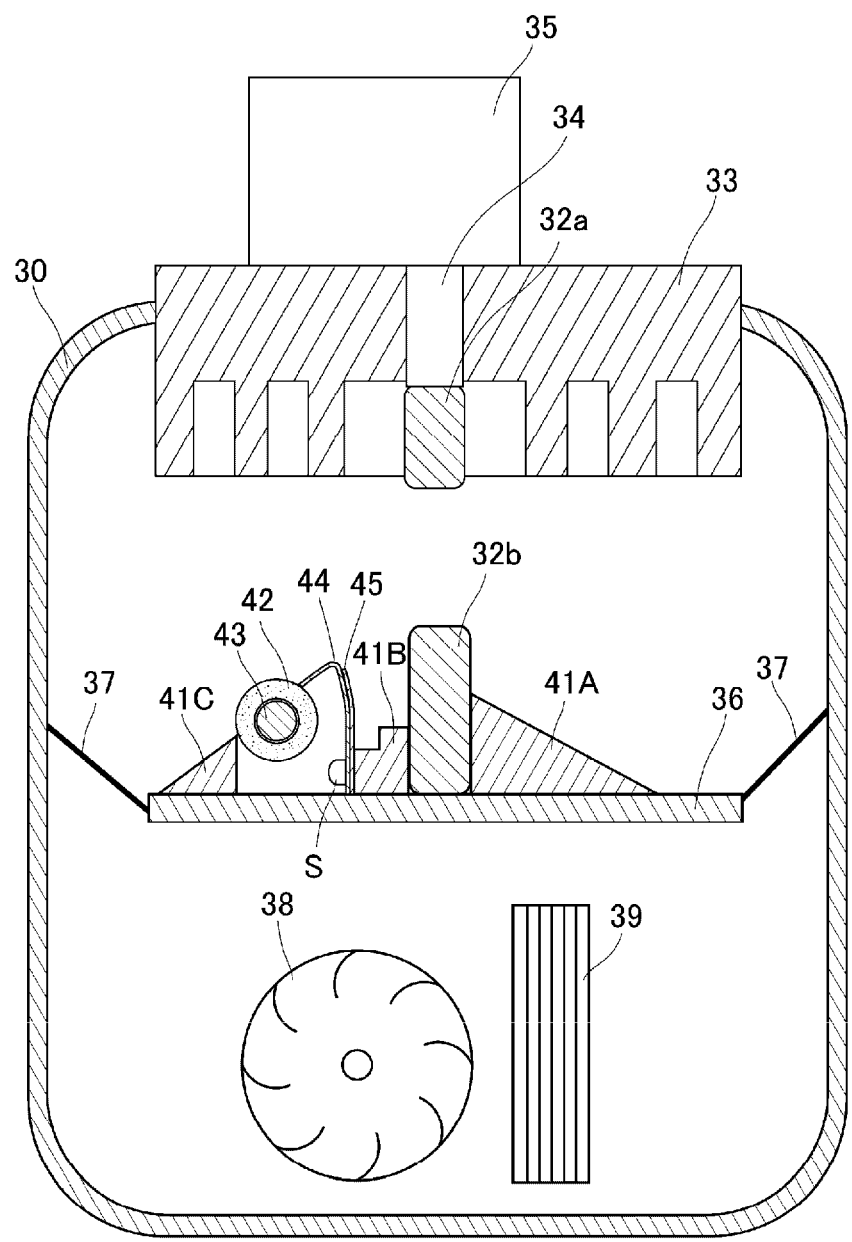
FIG. 3 is a cross-sectional view of a chamber apparatus taken along a plane perpendicular to a traveling direction of laser light.

FIG. 3 is a cross-sectional view of the chamber apparatus CH taken along a plane perpendicular to the traveling direction of the laser light. The chamber apparatus CH includes an enclosure 30, a pair of windows 31a and 31b, a pair of electrodes 32a and 32b, an insulating section 33, a pulse power module 35, an electrode holder 36, a crossflow fan 38, a motor 38M, a dielectric pipe 42, an inner electrode 43, an outer electrode 44, and a leaf spring 45 as primary components, as shown in FIGS. 2 and 3.

The windows 31a and 31b are provided in the enclosure 30 in positions facing each other. The window 31a is provided at one end of the enclosure 30 in the traveling direction of the laser light, and the window 31b is provided at the other end of the enclosure 30 in the traveling direction of the laser light. The gas laser apparatus 100 is configured to output the laser light as a result of optical oscillation that occurs on the optical path of the gas laser apparatus 100 including the enclosure 30, so that the laser light generated in the enclosure 30 exits out of the enclosure 30 via the windows 31a and 31b, as will be described later. The windows 31a and 31b are made, for example, of calcium fluoride. The windows 31a and 31b may each be coated with a film made, for example, of a fluoride or an oxide.

A laser gas is encapsulated in the enclosure 30. The longitudinal direction of the pair of electrodes 32a and 32b extends along the traveling direction of the laser light, and the pair of electrodes 32a and 32b are arranged so as to face each other in the enclosure 30. The space between the electrodes 32a and 32b in the enclosure 30 is sandwiched between the windows 31a and 31b. The electrodes 32a and 32b are each a primary discharge electrode configured to produce glow discharge that excites the laser media. In Comparative Example, the electrode 32a is the cathode, and the electrode 32b is the anode.

An opening is formed in the enclosure 30, and the opening is closed by the insulating section 33 including an insulator. The electrode 32a is supported by the insulating section 33. A feedthrough section 34 formed of a conductive member is buried in the insulating section 33. The feedthrough section 34 is configured to apply voltage supplied from the pulse power module 35 to the electrode 32a. The electrode 32b is supported by the electrode holder 36 and electrically connected to the electrode holder 36. The electrode holder 36 is electrically connected to the enclosure 30 via wiring lines 37.

The charger BC disposed outside the enclosure 30 is connected to the pulse power module 35. The charger BC is a DC power supplier configured to charge, by using predetermined voltage, a capacitor that is not shown but is provided in the pulse power module 35. The pulse power module 35 includes a switch controlled by the controller CO. When the switch in the off state is turned on, the pulse power module 35 is configured to boost the voltage applied from the charger BC to generate pulsed high voltage and apply the high voltage to the electrode 32a and the inner electrode 43.

A first guide 41A, a second guide 41B, and a third guide 41C are provided on the electrode holder 36. The electrode 32b is sandwiched between the first guide 41A and the second guide 41B and fixed onto the electrode holder 36.

Figure 4:
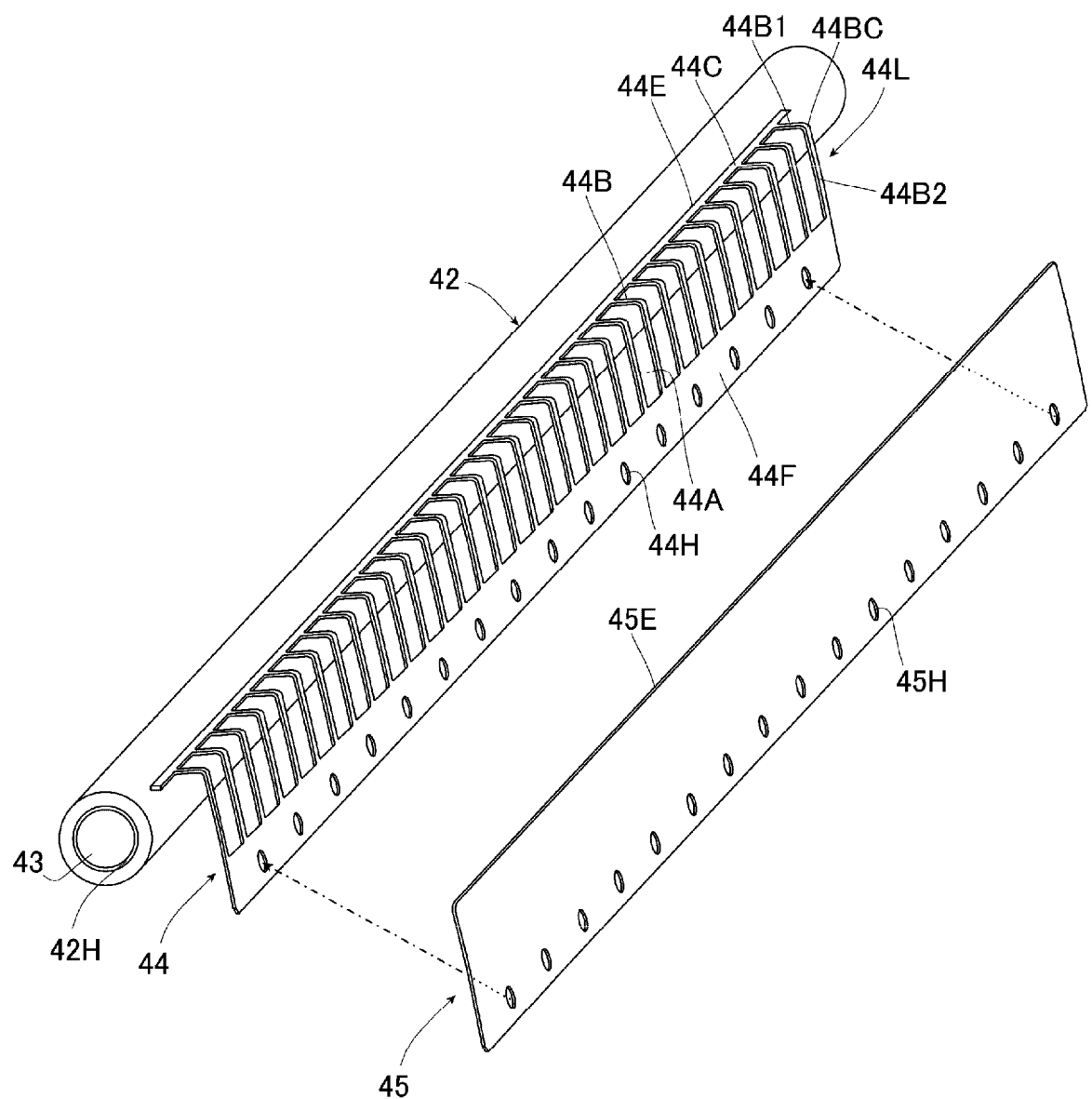
FIG. 4 is a perspective view showing a dielectric pipe, an inner electrode, an outer electrode, and a leaf spring.
Figure 5:
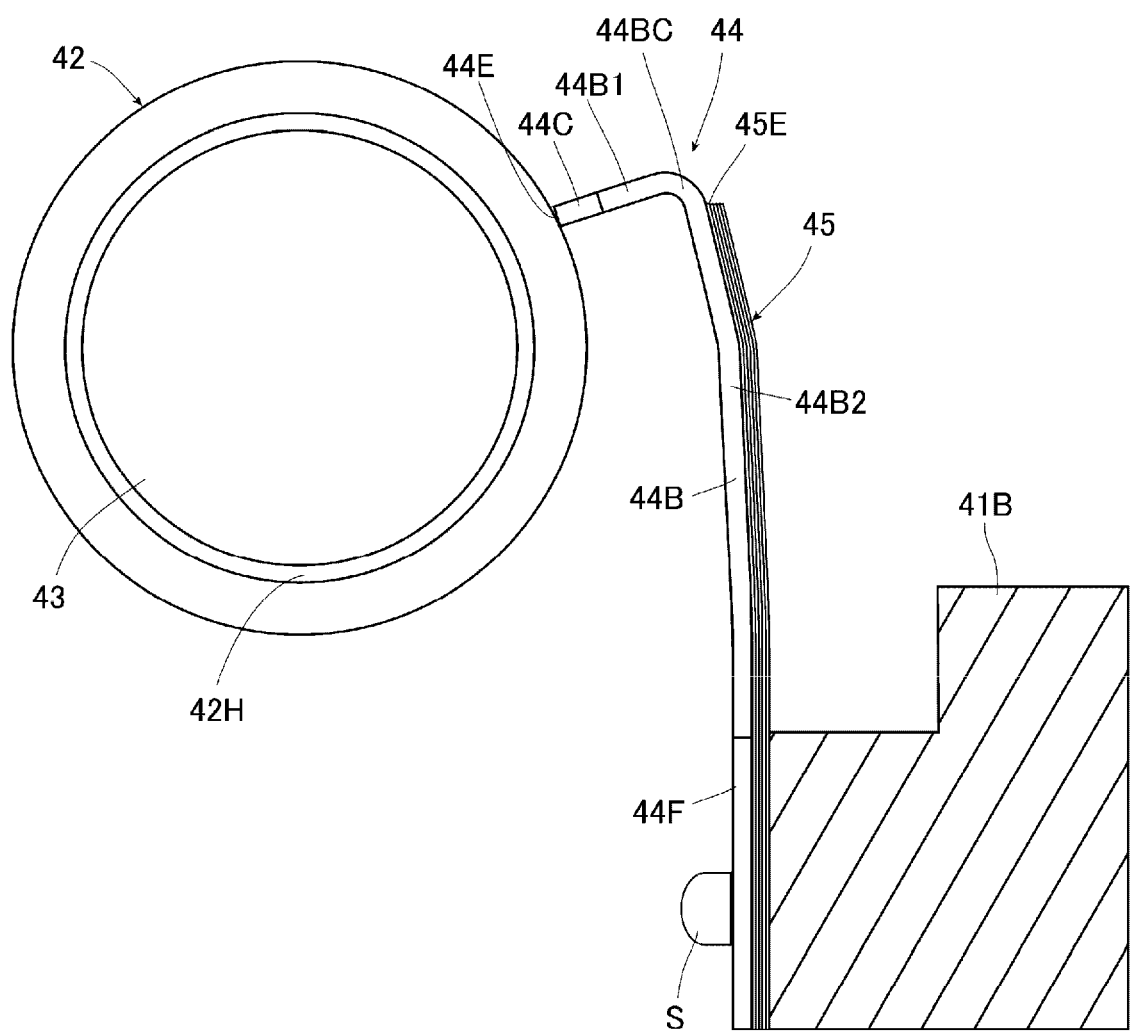
FIG. 5 is a cross-sectional view taken along a plane perpendicular to the traveling direction of the laser light and showing the dielectric pipe, the inner electrode, the outer electrode, and the leaf spring.

FIG. 4 is a perspective view showing the dielectric pipe 42, the inner electrode 43, the outer electrode 44, and the leaf spring 45, and FIG. 5 is a cross-sectional view taken along a plane perpendicular to the traveling direction of the laser light and showing the dielectric pipe 42, the inner electrode 43, the outer electrode 44, and the leaf spring 45. In FIG. 4, the leaf spring 45 is separate from the outer electrode 44 for clarity. The dielectric pipe 42 has a cylindrical shape and is so disposed that the longitudinal direction thereof extends along the traveling direction of the laser light, as shown in FIGS. 4 and 5. The dielectric pipe 42 is made of a dielectric, such as an aluminum oxide. The inner electrode 43, the longitudinal direction of which extends along the longitudinal direction of the dielectric pipe 42, is disposed in a through hole 42H of the dielectric pipe 42. Fixed pipes 42a and 42b are connected to opposite ends of the dielectric pipe 42, as shown in FIG. 2. A wiring line that is not shown but is connected to one end of the inner electrode 43 is disposed in a through hole of one of the fixed pipes, the fixed pipe 42a, and a wiring line that is not shown but is connected to the other end of the inner electrode 43 is disposed in the through hole of the other fixed pipe, the fixed pipe 42b. These wiring lines are connected to the feedthrough section 34. The feedthrough section 34 is therefore configured to apply the voltage supplied from the pulse power module 35 to the inner electrode 43.

The outer electrode 44 is in contact with the outer circumferential surface of the dielectric pipe 42. The outer electrode 44 is electrically connected to the electrode holder 36. Therefore, the outer electrode 44 is electrically connected to the electrode 32b and is also electrically connected to the enclosure 30 via the wiring lines 37. The outer electrode 44 includes a contact plate 44C, a ladder section 44L, and a fixing plate 44F. The contact plate 44C has the shape of a substantially rectangular plate having the longitudinal direction extending along the longitudinal direction of the dielectric pipe 42 and is in contact with the outer circumferential surface of the dielectric pipe 42. An edge 44E of the contact plate 44C, which is the edge extending along the longitudinal direction of the dielectric pipe 42, specifically, the portion from one end to the other end of the edge 44E is in contact with the outer circumferential surface of the dielectric pipe 42.

The ladder section 44L includes a plurality of bar members 44B. The bar members 44B are juxtaposed on the opposite side of the edge 44E of the contact plate 44C, which is the edge in contact with the dielectric pipe 42 from the dielectric pipe 42. The plurality of bar members 44B are therefore juxtaposed along the longitudinal direction of the contact plate 44C. In Comparative Example, the bar members 44B are parallel to one another. The bar members 44B each include a first section 44B1, a bent section 44BC, and a second section 44B2. The first section 44B1 is connected to the contact plate 44C and linearly extends in the in-plane direction perpendicular to the longitudinal direction of the dielectric pipe 42 in the direction away from the dielectric pipe 42. The bent section 44BC is connected to the first section 44B1 and bent in the in-plane direction perpendicular to the longitudinal direction of the dielectric pipe 42. The second section 44B2 is connected to the bent section 44BC and extends in the in-plane direction perpendicular to the longitudinal direction of the dielectric pipe 42.

The opposite side of the second sections 44B2 of the bar members 44B from the bent sections 44BC is connected to the fixing plate 44F. The fixing plate 44F has the shape of a substantially rectangular plate and has a longitudinal direction extending along the longitudinal direction of the dielectric pipe 42. The bar members 44B are therefore each connected to an edge of the fixing plate 44F that is the edge extending along the longitudinal direction of the dielectric pipe 42. A plurality of screw holes 44H are formed in the fixing plate 44F at substantially equal intervals.

Since the outer electrode 44 has the configuration described above, a plurality of openings 44A each surrounded by the contact plate 44C, a pair of bar members 44B, and the fixing plate 44F are formed in the ladder section 44L. The outer electrode 44 can be manufactured, for example, by punching. Specifically, a single metal plate is punched to form the openings 44A and the screw holes 44H, and the bar members 44B of the ladder section 44L are each three-dimensionally deformed to form the first section 44B1, the bent section 44BC, and the second section 44B2. The outer electrode 44 is made, for example, of brass. In this case, even when the laser gas containing fluorine is encapsulated in the enclosure 30 as described above, a passivation state can be achieved on the surface of the outer electrode 44 to suppress corrosion due to the laser gas. The outer electrode 44 has a thickness of, for example, 0.5 mm.

The leaf spring 45 has a laminate structure in which a plurality of metal plates having the same shape are stacked on each other. The metal plates each have a substantially rectangular shape. In Comparative Example, the thickness of each of the metal plates is smaller than the thickness of the outer electrode 44, for example, 0.1 mm. Further, in Comparative Example, the difference in thickness between the leaf spring 45 and the outer electrode 44 is, for example, smaller than or equal to the thickness of one metal plate. For example, the thickness of the leaf spring 45 and the thickness of the outer electrode 44 are made substantially equal to each other. When the thickness of the outer electrode 44 is 0.5 mm as described above, the leaf spring 45 is formed by stacking, for example, five metal plates each having a thickness of 0.1 mm. A plurality of screw holes 45H are formed in the leaf spring 45. The screw holes 45H are provided in positions where the screw holes 45H coincide with the screw holes 44H in the outer electrode 44 when the leaf spring 45 is overlaid on the outer electrode 44. The leaf spring 45 has a concave shape facing the outer electrode 44, and when the leaf spring 45 is overlaid on the outer electrode 44 and screws are screwed into the screw holes 44H and 45H so that the leaf spring 45 and the outer electrode 44 are fixed to each other, a principal surface of the leaf spring 45 that is the principal surface facing the outer electrode 44 presses the outer electrode 44. In this state, an edge 45E of the leaf spring 45, which is one of the edges thereof extending along the longitudinal direction of the dielectric pipe 42, is located on the bent sections 44BC of the bar members 44B. The leaf spring 45 is made, for example, of brass. In this case, even when the laser gas containing fluorine is encapsulated in the enclosure 30, a passivation state can be achieved on the surface of the leaf spring 45 to suppress corrosion, as in the case of the outer electrode 44.

The outer electrode 44 and the leaf spring 45 are fixed to the second guide 41B with screws S screwed into the screw holes 44H and 45H. The second guide 41B is therefore a fixing member to which the outer electrode 44 and the leaf spring 45 are fixed. In this state, the leaf spring 45 presses the outer electrode 44 over the entire principal surface of the leaf spring 45 that is in contact with the bar members 44B, and the edge 44E of the contact plate 44C of the outer electrode 44 is pressed against and in contact with the outer circumferential surface of the dielectric pipe 42. Out of portions of the outer circumferential surface of the dielectric pipe 42, the portion substantially facing the portion in contact with the contact plate 44C is in contact with the third guide 41C. Therefore, even when the elastic force of the leaf spring 45 causes the outer electrode 44 to press the dielectric pipe 42, the dielectric pipe 42 is supported by the third guide 41C.

The inner electrode 43 and the outer electrode 44 face each other via the dielectric pipe 42. When high voltage is applied to the inner electrode 43 and the outer electrode 44, corona discharge occurs in the vicinity of the dielectric pipe 42 and the outer electrode 44. The corona discharge assists the glow discharge that occurs in the space between the electrodes 32a and 32b. The inner electrode 43 and the outer electrode 44 are therefore preionization electrodes configured to assist the glow discharge generated by the electrodes 32a and 32b.

The crossflow fan 38 is disposed in a space in the enclosure 30 that is the space on the opposite side of the electrode holder 36 from the electrode 32b, as shown in FIGS. 2 and 3. The space in the enclosure 30 where the crossflow fan 38 is disposed and the space between the pair of electrodes 32a and 32b communicate with each other. The laser gas encapsulated in the enclosure 30 therefore circulates in a predetermined direction when the crossflow fan 38 rotates. The motor 38M disposed outside the enclosure 30 is connected to the crossflow fan 38. The rotation produced by the motor 38M rotates the crossflow fan 38. The motor 38M is turned on and off and the rotational speed thereof is adjusted under the control of the controller CO. The controller CO is therefore configured to be capable of adjusting the circulation speed of the laser gas circulating in the enclosure 30 by controlling the motor 38M.

A heat exchanger 39 is disposed next to the crossflow fan 38. At least part of the laser gas circulated by the crossflow fan 38 passes through the heat exchanger 39, which is configured to adjust the temperature of the laser gas.

An optical path tube 51 is connected to the one end of the enclosure 30, which is the end where the window 31a is provided. The output coupling mirror OC is provided on the side facing the one end of the enclosure 30 as a reference and disposed in the optical path tube 51. The output coupling mirror OC is an optical element on which the laser light that exits via the window 31a is incident and is configured to transmit part of the light that exits via the window 31a and reflect the other part of the light back into the enclosure 30 via the window 31a. The output coupling mirror OC is formed, for example, of an element including a calcium fluoride substrate on which a dielectric multilayer film is formed.

An optical path tube 52 is connected to the other end of the enclosure 30, which is the end where the window 31b is provided. The line narrowing module 60 is connected to the optical path tube 52. The line narrowing module 60 is therefore provided on the side facing the other end of the enclosure 30 as a reference. The line narrowing module 60 includes an enclosure 61, a grating 62, and prisms 63 and 64. An opening is formed in the enclosure 61, and the space in the enclosure 61 and the space in the optical path tube 52 communicate with each other via the opening.

The grating 62 and the prisms 63 and 64 are disposed in the enclosure 61. The grating 62 and the prisms 63 and 64 are optical elements on which the laser light that exits via the window 31b is incident. The grating 62 is disposed in the Littrow arrangement in which the wavelength dispersion surface of the grating 62 substantially coincides with the plane perpendicular to the propagation direction of the laser light and the angle of incidence of the laser light substantially coincides with the angle of diffraction of the laser light. In Comparative Example, the grating 62 may instead be an echellette grating blazed with respect to the wavelength of about 193 nm.

At least one of the prisms 63 and 64 is fixed onto the rotary stage, and the one of the prisms 63 and 64 that is fixed onto the rotary stage is slightly rotated to adjust the angle of incidence of the light incident on the grating 62. Adjusting the angle of incidence of the light incident on the grating 62 adjusts the wavelength of the light reflected off the grating 62. The wavelength of the light returning to the enclosure 30 is therefore adjusted to a desired wavelength when the light that exits via the window 31b of the enclosure 30 is reflected off the grating 62 via the prisms 63 and 64. The number of prisms disposed in the line narrowing module 60 is two in Comparative Example and may instead be one or three or more.

An optical resonator is formed by the output coupling mirror OC and the grating 62 so provided as to sandwich the enclosure 30, and the enclosure 30 is disposed in the optical path of the optical resonator. The light that exits out of the enclosure 30 therefore travels back and forth between the grating 62 of the line narrowing module 60 and the output coupling mirror OC and is amplified whenever the light passes through the laser gain space between the electrodes 32a and 32b. Part of the amplified light passes through the output coupling mirror OC and exits as pulsed laser light.

The energy monitoring module 20 is disposed in the optical path of the pulsed laser light that exits via the output coupling mirror OC of the laser oscillator LO. The energy monitoring module 20 includes an enclosure 21, a beam splitter 22, and a pulse energy sensor 23. The enclosure 21 is connected to the optical path tube 51. The beam splitter 22 and the pulse energy sensor 23 are each an optical element on which the laser light that exits via the window 31a is incident. An opening is formed in the enclosure 21, and the space in the enclosure 21 and the space in the optical path tube 51 communicate with each other via the opening. The beam splitter 22 and the pulse energy sensor 23 are disposed in the enclosure 21.

The beam splitter 22 is configured to transmit the pulsed laser light outputted from the laser oscillator LO at high transmittance and reflect part of the pulsed laser light toward the light receiving surface of the pulse energy sensor 23. The pulse energy sensor 23 is configured to detect the pulse energy of the pulsed laser light incident on the light receiving surface and output data on the detected pulse energy to the controller CO.

An opening is formed at the opposite side of the enclosure 21 of the energy monitoring module 20 from the side to which the optical path tube 51 is connected, and the optical path tube 53 is connected to the enclosure 21 so as to surround the opening. The space in the optical path tube 51, the space in the enclosure 21, and the space in the optical path tube 53 therefore communicate with each other. The optical path tube 53 is connected to the enclosure 10. A laser light exiting window OW is provided in a position on the enclosure 10 that is the position surrounded by the optical path tube 53. The light passing through the beam splitter 22 of the energy monitoring module 20 therefore exits out of the enclosure 10 through the optical path tube 53 and via the laser light exiting window OW.

The optical path tubes 51, 52, and 53 and the enclosures 21 and 61 are each filled with a purge gas. The purge gas includes an inert gas, such as high-purity nitrogen having a small amount of impurities, such as oxygen. The purge gas is supplied from a purge gas supply source disposed outside the enclosure 10 into the optical path tubes 51, 52, and 53 and the enclosures 21 and 61 through pipes that are not shown.

A laser gas supply source LT, which stores the laser gas, is further disposed outside the enclosure 10. The laser gas supply source LT is configured to supply a plurality of gases that form the laser gas. In Comparative Example, a mixed gas containing $F_2$ and Ar is supplied. When the laser gas is made of KrF, the laser gas supply source LT is configured to supply a mixed gas containing $F_2$ and Kr. A pipe is connected to the laser gas supply source LT, and the pipe enters the enclosure 10. The pipe is connected to a laser gas supplier LG. The laser gas supplier LG is provided with a flow rate control valve and other valves that are not shown, and another pipe connected to the enclosure 30 is connected to the laser gas supplier LG. The laser gas supplier LG is configured to mix the plurality of gases at a desired composition ratio in accordance with a control signal from the controller CO to form the laser gas and output the laser gas to the other pipe. The laser gas supply source LT is therefore configured to supply the laser gas into the enclosure 30 via the other pipe. A connection portion where the other pipe is connected to the enclosure 30 is a laser gas supply port LSP, via which the laser gas is supplied into the enclosure 30.

An exhauster ED is disposed in the enclosure 10. A pipe connected to the enclosure 30 is connected to the exhauster ED. The exhauster ED is configured to exhaust the gas in the enclosure 30 into the enclosure 10 through the pipe. In this process, the exhauster ED is configured to adjust the amount of exhaust gas and other factors in accordance with a control signal from the controller CO and performs predetermined processing on the gas exhausted from the interior of the enclosure 30. A connection portion where the pipe is connected to the enclosure 30 is a laser gas exhaust port LEP, via which the gas is exhausted from the interior of the enclosure 30.

The enclosure 10 is provided with an exhaust duct 11. The gas in the enclosure 10 is exhausted out of the enclosure 10 through the exhaust duct 11. The gas to be exhausted from the exhauster ED into the enclosure 10 and the gas to be exhausted by a configuration that is not shown into the enclosure 10 through the optical path tubes 51, 52, and 53 and other components are therefore exhausted out of the enclosure 10 through the exhaust duct 11.

2.2 Operation

The operation of the gas laser apparatus 100 in Comparative Example will next be described.

In a state before the gas laser apparatus 100 outputs the laser light, a configuration that is not shown fills the interiors of the optical path tubes 51, 52, and 53 and the interiors of the enclosures 21 and 61 with a purge gas. Further, the laser gas from the laser gas supply source LT is supplied into the enclosure 30 via the laser gas supply port LSP, and the supplied laser gas is circulated. Specifically, the laser gas is supplied into the enclosure 30 via the laser gas supply port LSP, and the gas exhausted via the laser gas exhaust port LEP is exhausted into the enclosure 10 via the exhauster ED, so that the laser gas is encapsulated in the enclosure 30. The controller CO is configured to control the motor 38M to cause the crossflow fan 38 to rotate, and the rotation of the crossflow fan 38 circulates the laser gas.

When the gas laser apparatus 100 outputs the laser light, the controller CO is configured to control a switch in the charger BC and the switch in the pulse power module 35 to cause them to apply high voltage to each of the space between the electrodes 32a and 32b and the space between the inner electrode 43 and the outer electrode 44. It is, however, noted that the timing at which the high voltage is applied to the space between the inner electrode 43 and the outer electrode 44 is slightly earlier than the timing at which the high voltage is applied to the space between the electrodes 32a and 32b. When the high voltage is applied to the space between the inner electrode 43 and the outer electrode 44, corona discharge occurs in the vicinity of the dielectric pipe 42, and ultraviolet light is radiated. Thereafter, when the high voltage is applied to the space between the electrodes 32a and 32b, the insulation between the electrodes 32a and 32b is broken down and discharge occurs. The energy of the discharge excites the laser media contained in the laser gas between the electrodes 32a and 32b, and the excited laser media emit spontaneously emitted light when each returning to the ground state. Part of the light exits via the window 31b and is reflected off the grating 62 via the prisms 63 and 64. The light reflected off the grating 62 and propagating into the enclosure 30 via the window 31b has undergone line narrowing. The line-narrowed light causes the excited laser media to undergo stimulated emission, which amplifies the light. Light having a predetermined wavelength thus resonates in the space between the grating 62 and the output coupling mirror OC, whereby laser oscillation occurs. Part of the laser light then passes through the output coupling mirror OC and exits via the laser light exiting window OW.

At this point, the laser light reflected off the beam splitter 22 is received by the pulse energy sensor 23, and the pulse energy sensor 23 is configured to output a signal based on the intensity of the energy of the received laser light to the controller CO. The controller CO is configured to control the charger BC and the pulse power module 35 based on the signal to adjust the power of the outputted laser light.

2.3 Problems

Figure 6:
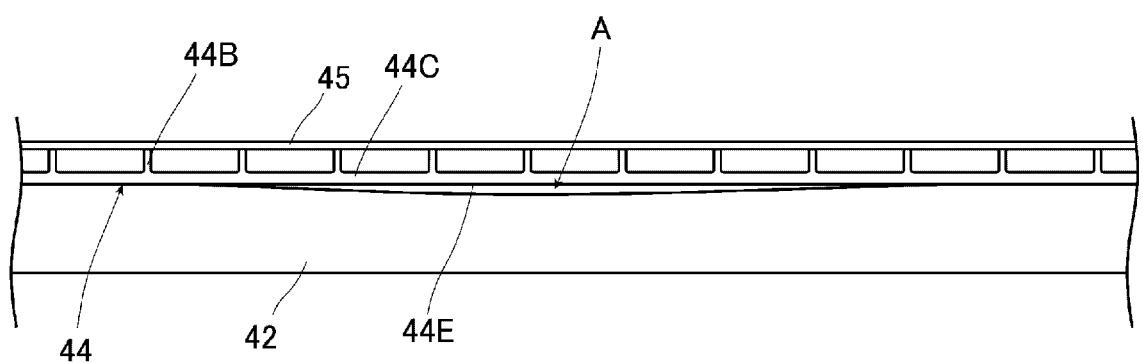
FIG. 6 shows a state in which an outer circumferential surface of the dielectric pipe is distorted.
Figure 7:
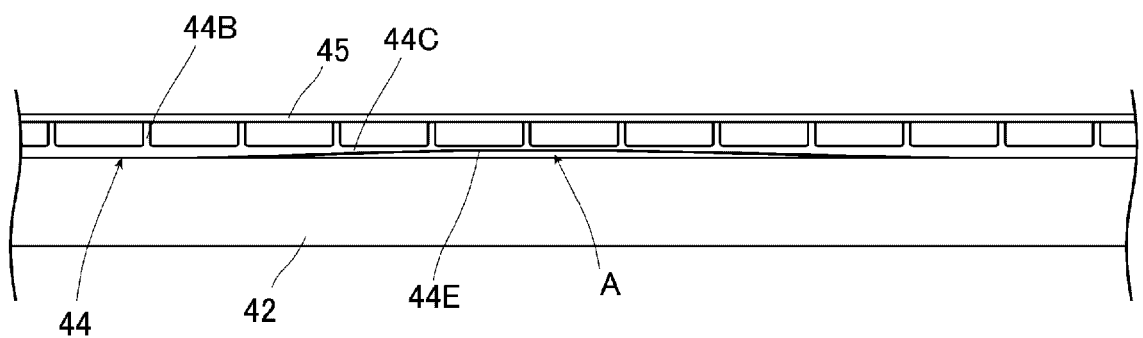
FIG. 7 shows a state in which part of the outer electrode is unevenly worn.

As described above, the outer electrode 44 is pressed by the leaf spring 45 against the dielectric pipe 42, and the edge 44E of the contact plate 44C from one end to the other end of the edge 44E is in contact with the dielectric pipe 42. However, the outer circumferential surface of the dielectric pipe 42 is distorted in some cases, as shown in FIG. 6. Further, when the high voltage is applied to the space between the inner electrode 43 and the outer electrode 44 a large number of times, the contact plate 44C of the outer electrode 44 is unevenly worn in some cases, as shown in FIG. 7. In any of the cases described above, a gap A may be formed between the outer circumferential surface of the dielectric pipe 42 and the contact plate 44C. When the gap A is formed between the outer circumferential surface of the dielectric pipe 42 and the contact plate 44C, uniform corona discharge along the longitudinal direction of the dielectric pipe 42 is unlikely to occur. Uniform glow discharge is therefore unlikely to occur between the electrodes 32a and 32b. The amplification of the laser light in the space between the electrode 32a and the electrode 32b therefore becomes unstable, and there is a concern about difficulty in stable emission of the laser light.

The following embodiments therefore show examples of a chamber apparatus capable of achieving a gas laser apparatus capable of stably outputting laser light.

3. Description of Chamber Apparatus According to First Embodiment

A chamber apparatus according to a first embodiment will next be described. The same components as those described above have the same reference characters, and duplicate description of the same components will be omitted unless otherwise specified.

3.1 Configuration

Figure 8:
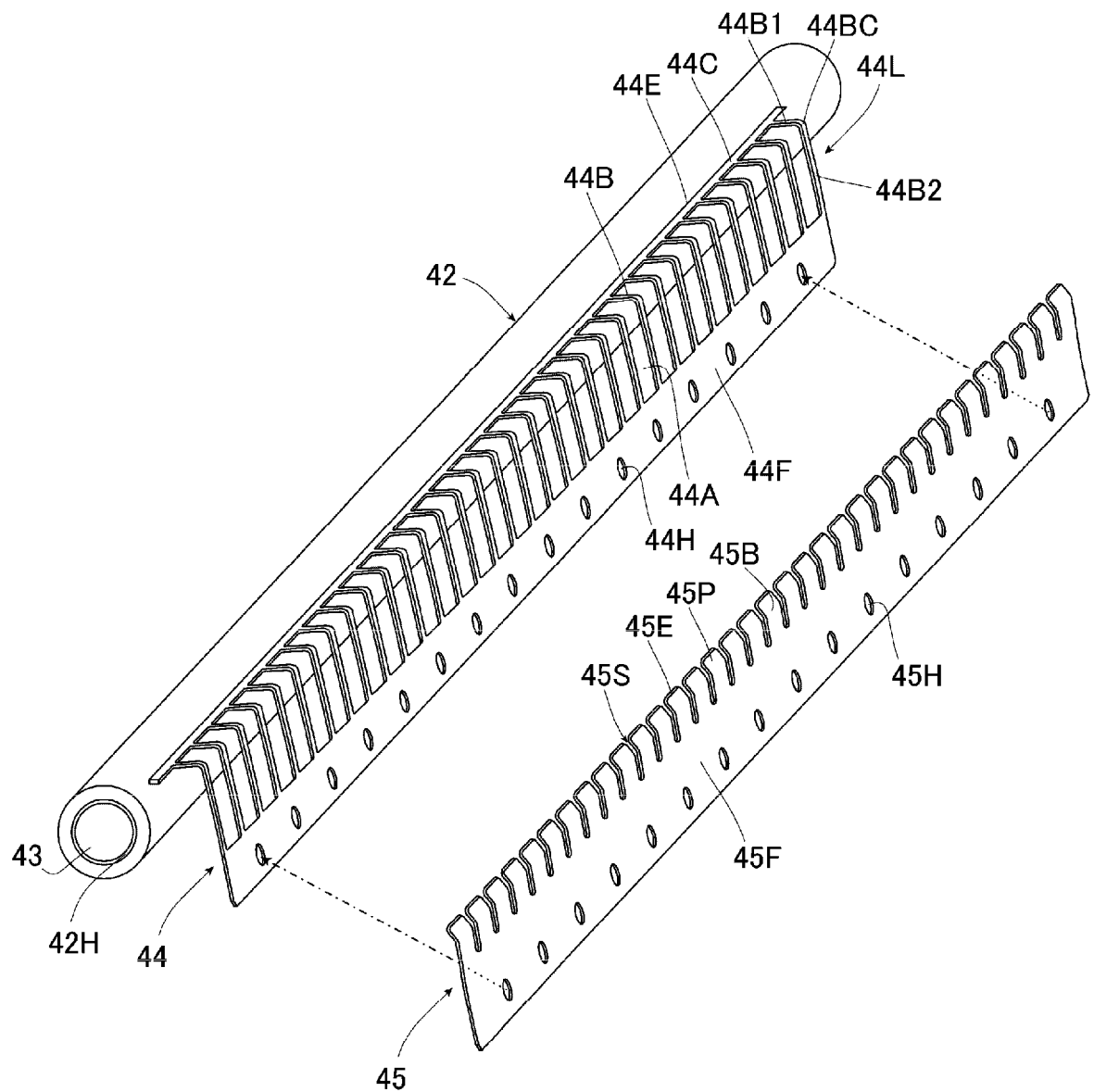
FIG. 8 is a perspective view showing the dielectric pipe, the inner electrode, the outer electrode, and the leaf spring of the chamber apparatus in a first embodiment.
Figure 9:
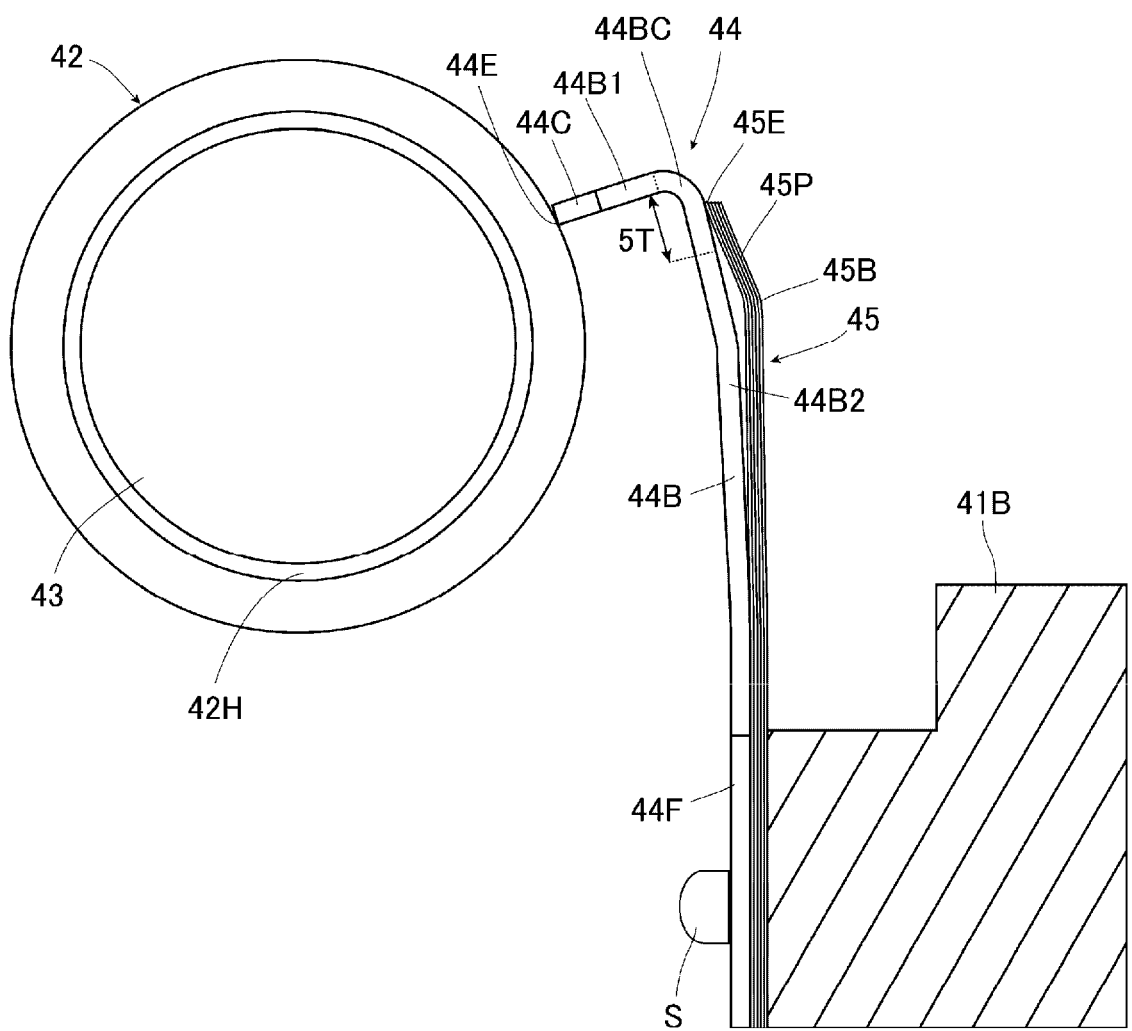
FIG. 9 is a cross-sectional view showing the dielectric pipe, the inner electrode, the outer electrode, and the leaf spring of the chamber apparatus in the first embodiment.

FIG. 8 is a perspective view showing in the same manner as in FIG. 4 the dielectric pipe 42, the inner electrode 43, the outer electrode 44, and the leaf spring 45 of the chamber apparatus CH in the present embodiment. FIG. 9 is a cross-sectional view showing in the same manner as in FIG. 5 the dielectric pipe 42, the inner electrode 43, the outer electrode 44, and the leaf spring 45 of the chamber apparatus CH in the present embodiment. The leaf spring 45 in the present embodiment includes a plurality of leaf spring pieces 45P separated by slits 45S resulting from cutting of the leaf spring 45 from the edge 45E along the longitudinal direction of the dielectric pipe 42, as shown in FIG. 8. The leaf spring pieces 45P therefore each include a pair of principal surfaces sandwiched between the corresponding slits 45S and facing each other. In the present embodiment, the longitudinal direction of each of the slits 45S is perpendicular to the edge 45E. The width of each of the slits 45S is, for example, greater than or equal to 1 mm but smaller than or equal to 10 mm. A portion of the leaf spring 45 that is the portion where no slit 45S is formed is a fixing section 45F extending along the longitudinal direction of the dielectric pipe 42, and the leaf spring pieces 45P are each connected to the fixing section 45F on the opposite side of the leaf spring pieces 45P from the edge 45E. The screw holes 45H are formed in the fixing section 45F.

The leaf spring pieces 45P each include a bent section 45B, which is bent along the edge 45E. The bent sections 45B cause the leaf spring pieces 45P to be convex toward the side away from the outer electrode 44, and the leaf spring pieces 45P are separate from the outer electrode 44 at the bent sections 45B as shown in FIG. 9. In the present embodiment, the edge 45E is configured to press the bar members 44B with the edge 45E being in contact with the bar members 44B of the outer electrode 44. The leaf spring 45 is therefore configured to press the bar members 44B in a position shifted from the bent sections 45B toward the edge 45E. In the present embodiment, the edge 45E of each of the leaf spring pieces 45P is configured to press the bent sections 44BC of the bar members 44B. In FIG. 9, the boundary between the first section 44B1 and the bent section 44BC and the boundary between the bent section 44BC and the second section 44B2 are each shown with a dotted line. The bent section 44BC refers to the section from the position where the bar member 44B starts bending from the first section 44B1 to the position separate from the first section 44B1 by the amount 5 times a thickness T of the bar member 44B when viewed along the longitudinal direction of the first section 44B1. In FIG. 9, the following section is labeled with 5T: the section from the first section 44B1 to the position separate therefrom by the amount 5 times the thickness T of the bar member 44B when viewed along the longitudinal direction of the first section 44B1. For example, when the thickness of the outer electrode 44 is 0.5 mm as described above, the bent section 44BC is the section from the position where the bar member 44B starts bending from the first section 44B1 to the position separate from the first section 44B1 by 2.5 mm when viewed along the longitudinal direction of the first section 44B1. The edge 45E of each of the leaf spring pieces 45P is configured to press part of the bent section 44BC.

Figure 10:
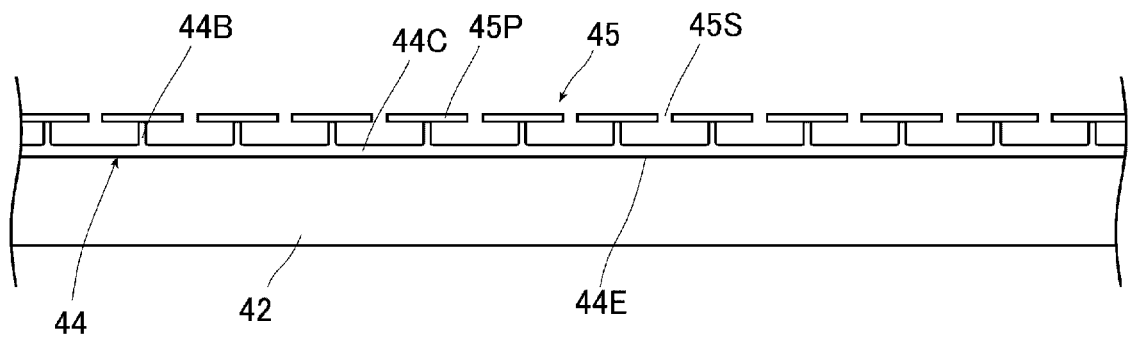
FIG. 10 shows the dielectric pipe, the outer electrode, and the leaf spring of the chamber apparatus in the first embodiment viewed from a direction perpendicular to a longitudinal direction of the dielectric pipe.

FIG. 10 shows the dielectric pipe 42, the outer electrode 44, and the leaf spring 45 of the chamber apparatus CH in the present embodiment viewed from a direction perpendicular to the longitudinal direction of the dielectric pipe 42. The slits 45S of the leaf spring 45 in the present embodiment are provided between the corresponding bar members 44B, as shown in FIG. 10. The leaf spring pieces 45P are therefore configured to individually press the bar members 44B.

3.2 Effects and Advantages

Figure 11:
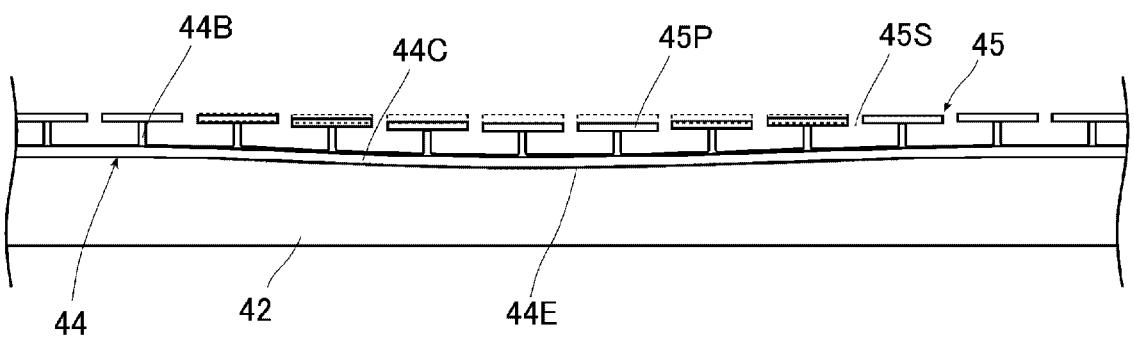
FIG. 11 shows a state in which the outer circumferential surface of the dielectric pipe is distorted in the first embodiment.
Figure 12:
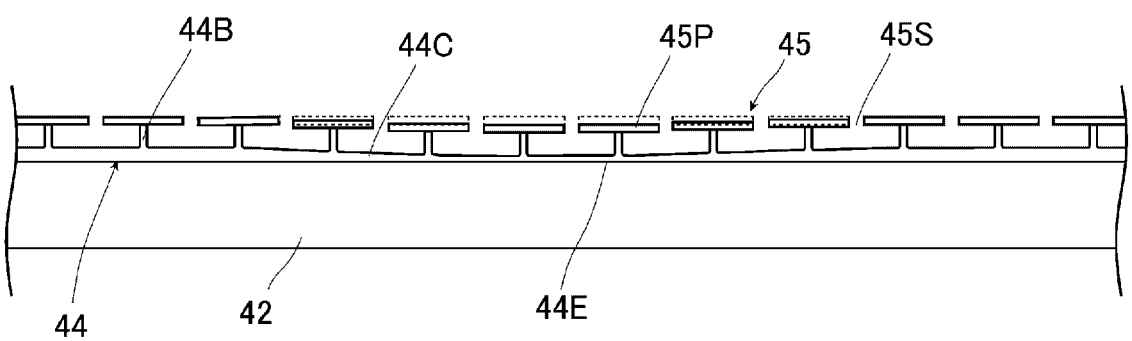
FIG. 12 shows a state in which part of the outer electrode is unevenly worn in the first embodiment.

FIG. 11 shows a state in which the outer circumferential surface of the dielectric pipe 42 is distorted as shown in FIG. 6, and FIG. 12 shows a state in which part of the outer electrode 44 is unevenly worn as shown in FIG. 7. In the chamber apparatus CH according to the present embodiment, the leaf spring 45 includes the plurality of leaf spring pieces 45P separated by the slits 45S resulting from the cutting of the leaf spring 45 from the edge 45E along the longitudinal direction of the dielectric pipe 42. The leaf spring pieces 45P are configured to be capable of individually pressing the outer electrode 44. Therefore, even when the outer circumferential surface of the dielectric pipe 42 is distorted as shown in FIG. 11, the surface of the outer electrode 44 follows the dielectric pipe 42 in an improved manner as compared with the case where the leaf spring 45 in Comparative Example is used. The broken lines in FIG. 11 show a state in which the leaf spring pieces 45P do not follow the distorted portion of the dielectric pipe 42. Further, even when part of the outer electrode 44 is unevenly worn, as shown in FIG. 12, the surface of the outer electrode 44 follows the dielectric pipe 42 in an improved manner as compared with the case where the leaf spring 45 in Comparative Example is used. The broken lines in FIG. 12 show a state in which the leaf spring pieces 45P do not follow the unevenly worn portion of the outer electrode 44. Formation of a gap between the dielectric pipe 42 and the outer electrode 44 can therefore be suppressed. Further, in the chamber apparatus CH according to the present embodiment, the leaf spring pieces 45P each include the bent section 45B bent along the edge 45E and are configured to press the bar members 44B in a position shifted from the bent sections 45B toward the edge 45E. The configuration described above can suppress edge warping of the leaf spring pieces 45P, whereby the leaf spring pieces 45P are configured to be capable of stably pressing the bar members 44B. The leaf spring 45 is thus configured to be capable of stably pressing the outer electrode 44 against the dielectric pipe 42, and formation of a gap between the dielectric pipe 42 and the outer electrode 44 can be suppressed as described above. Therefore, according to the present embodiment, it is possible to obtain a gas laser apparatus capable of stably outputting laser light. The gas laser apparatus 100 in the present embodiment is thus configured to be capable of stably outputting the laser light.

Further, in the chamber apparatus CH according to the present embodiment, the slits 45S formed in the leaf spring 45 are provided between the corresponding bar members 44B, and the leaf spring pieces 45P are configured to individually press the bar members 44B. That is, the bar members 44B and the leaf spring pieces 45P have a one-to-one correspondence. The surface of the outer electrode 44 can thus follow the dielectric pipe 42 in an improved manner as compared with a case where one leaf spring piece 45P presses the plurality of bar members 44B. Formation of a gap between the dielectric pipe 42 and the outer electrode 44 can thus be suppressed by a greater degree. It is noted unlike the present embodiment that one leaf spring piece 45P may be configured to press the plurality of bar members 44B.

Further, in the chamber apparatus CH according to the present embodiment, the longitudinal direction of the slits 45S is perpendicular to the edge 45E. A change in the pressing force exerted by the leaf spring pieces 45P on the bar members 44B depending on the positions of the leaf spring pieces 45P along the edge 45E can therefore be suppressed. It is noted unlike the present embodiment that the longitudinal direction of the slits 45S may not be perpendicular to the edge 45E.

Further, in the chamber apparatus CH according to the present embodiment, the edges 45E of the leaf spring pieces 45P of the leaf spring 45 are configured to press the bar members 44B. An unnecessary increase in the size of the leaf spring pieces 45P can thus be suppressed.

Further, in the chamber apparatus CH according to the present embodiment, the leaf spring 45 is configured to press the bent sections 44BC of the bar members 44B. The elastic force of the leaf spring 45 can therefore be efficiently conveyed to the contact plate 44C of the outer electrode 44. The surface of the outer electrode 44 can thus follow the dielectric pipe 42 in a further improved manner as compared with a case where the leaf spring 45 presses the second sections 44B2 of the bar members 44B. Formation of a gap between the dielectric pipe 42 and the outer electrode 44 can thus be suppressed by a greater degree. It is noted unlike the present embodiment that the leaf spring 45 may be configured to press the second sections 44B2 of the bar members 44B.

Further, in the chamber apparatus CH according to the present embodiment, the leaf spring 45 has a laminate structure in which a plurality of metal plates are stacked on each other. Therefore, as compared with a case where the leaf spring 45 is formed of a single metal plate, the range over which the leaf spring 45 is elastically deformed widens, and plastic deformation of the leaf spring 45 can be suppressed while the leaf spring 45 produces elastic force. It is noted unlike the present embodiment that the leaf spring 45 may be formed of a single metal plate.

4. Description of Chamber Apparatus According to Second Embodiment

A chamber apparatus according to a second embodiment will next be described. The same components as those described above have the same reference characters, and duplicate description of the same components will be omitted unless otherwise specified.

4.1 Configuration

Figure 13:
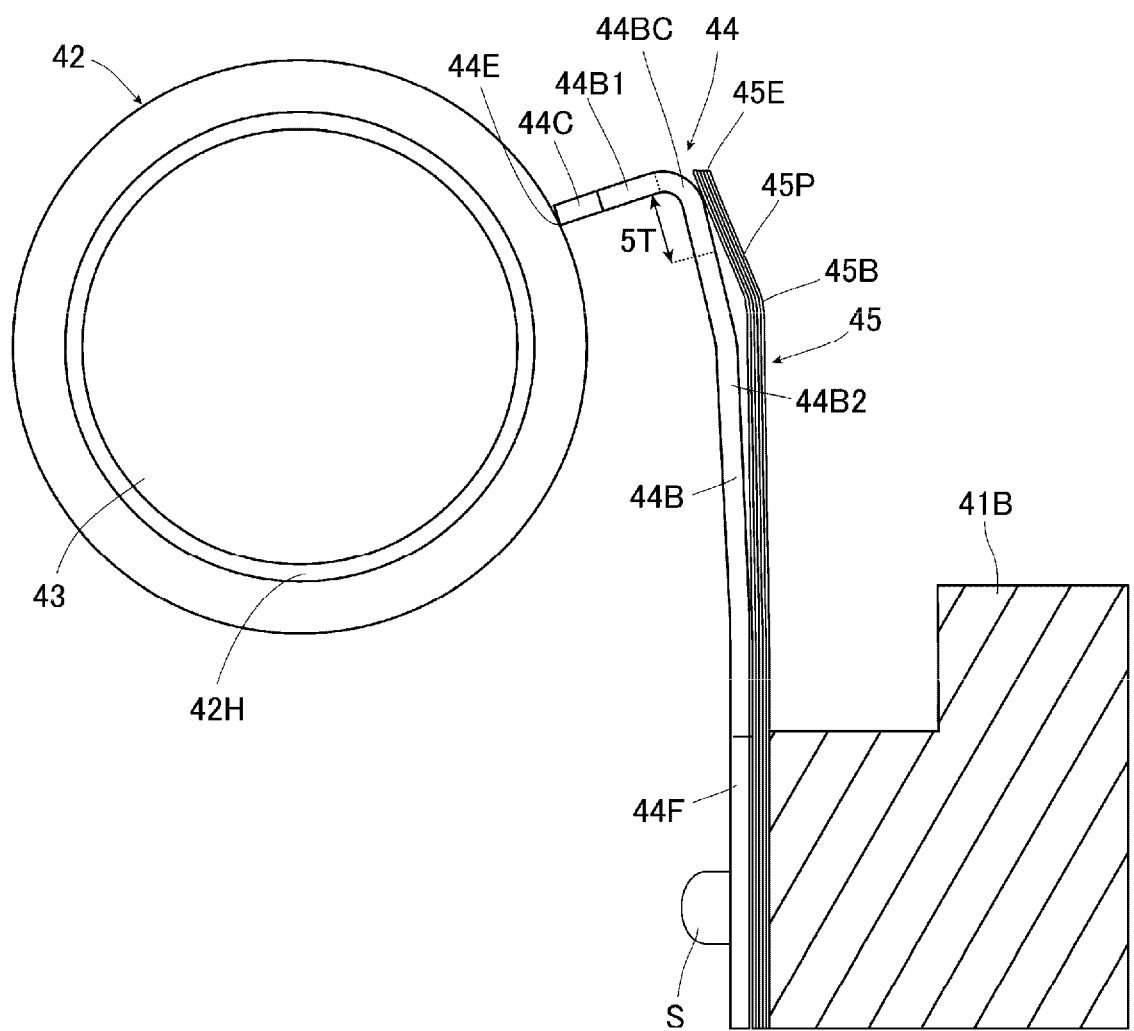
FIG. 13 is a cross-sectional view showing the dielectric pipe, the inner electrode, the outer electrode, and the leaf spring of the chamber apparatus in a second embodiment in the same manner as in FIG. 5.

FIG. 13 is a cross-sectional view showing the dielectric pipe 42, the inner electrode 43, the outer electrode 44, and the leaf spring 45 of the chamber apparatus CH in the present embodiment in the same manner as in FIG. 5. The leaf spring 45 in the present embodiment extends to the position where the leaf spring pieces 45P overlap with the first sections 44B1, as shown in FIG. 13. The principal surfaces of the leaf spring pieces 45P of the leaf spring 45 in the present embodiment are thus configured to press the bent section 44BC of the bar members 44B.

4.2 Effects and Advantages

In the chamber apparatus CH according to the present embodiment, since the principal surfaces of the leaf spring pieces 45P of the leaf spring 45 are configured to press the bent sections 44BC of the bar members 44B, the contact area where the bar members 44B are in contact with the leaf spring 45 can be increased. Scratches and other damages on the outer electrode 44 due to the force received from the leaf spring 45 can therefore be suppressed.

5. Description of Chamber Apparatus According to Third Embodiment

A chamber apparatus according to a third embodiment will next be described. The same components as those described above have the same reference characters, and duplicate description of the same components will be omitted unless otherwise specified.

5.1 Configuration

Figure 14:
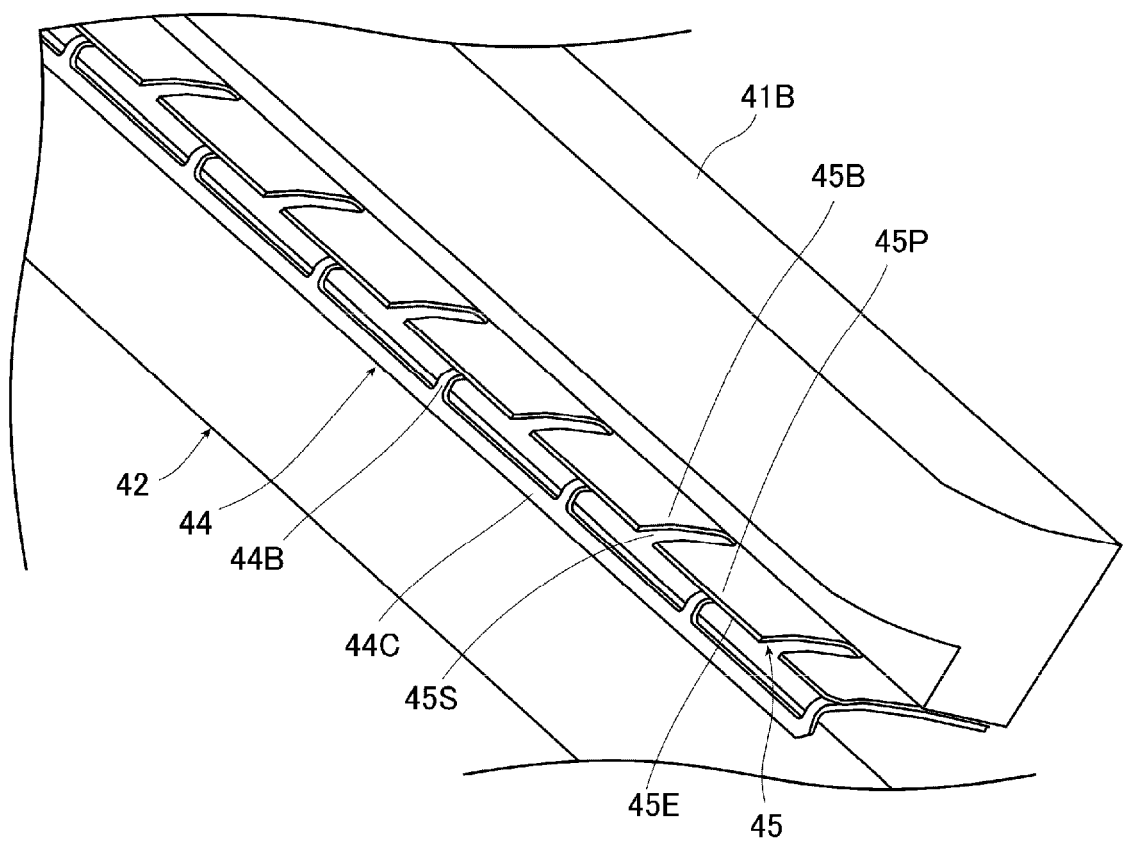
FIG. 14 is a perspective view showing the dielectric pipe, the inner electrode, the outer electrode, the leaf spring, and a second guide of the chamber apparatus in a third embodiment.

FIG. 14 is a perspective view showing the dielectric pipe 42, the inner electrode 43, the outer electrode 44, the leaf spring 45, and the second guide 41B of the chamber apparatus CH in the present embodiment. The leaf spring 45 in the present embodiment differs from the leaf spring 45 in the first embodiment in that the slits 45S extend to the second guide 41B. As described above, the second guide 41B is a fixing member to which the outer electrode 44 and the leaf spring 45 are fixed. The slits 45S of the leaf spring 45 in the present embodiment therefore extend to the fixing member to which the outer electrode 44 and the leaf spring 45 are fixed.

5.2 Effects and Advantages

In the chamber apparatus CH according to the present embodiment, the slits 45S of the leaf spring 45 extend to the second guide 41B, which is a fixing member, whereby the movable range of each of the leaf spring pieces 45P is larger than in the case where the slits 45S do not extend to the second guide 41B. The outer electrode 44 can therefore be pressed against the outer circumferential surface of the dielectric pipe 42 even when the outer circumferential surface of the dielectric pipe 42 is greatly distorted or the outer electrode 44 is greatly unevenly worn. Therefore, even in these cases, formation of a gap between the dielectric pipe 42 and the outer electrode 44 can be suppressed.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser chamber apparatus comprising:
    a dielectric pipe;
    an inner electrode extending along a longitudinal direction of the pipe and disposed in a through hole in the pipe;
    an outer electrode including a contact plate extending along the longitudinal direction of the pipe and being in contact with an outer circumferential surface of the pipe and a ladder section formed of a plurality of bar members each having one end connected to the contact plate and juxtaposed along a longitudinal direction of the contact plate; and
    a leaf spring extending along the longitudinal direction of the pipe, being a separate member from the outer electrode, and configured to contact with the outer electrode and to press the outer electrode against the pipe,
    the leaf spring including a plurality of leaf spring pieces separated by slits resulting from cutting of the leaf spring from an edge thereof along the longitudinal direction of the pipe, and
    the leaf spring pieces each include a bent section bent along the edge and are configured to contact with the bar members in a position shifted from the bent sections toward the edge and to press the bar members.

2. The laser chamber apparatus according to claim 1, further comprising
    a fixing member extending along the longitudinal direction of the pipe and configured to press and fix the outer electrode and the leaf spring, wherein
    the outer electrode includes a fixing plate extending along the longitudinal direction of the pipe, connected to another end of each of the bar members, and fixed to the fixing member,
    the leaf spring includes a fixing portion extending along the longitudinal direction of the pipe, connected to an opposite side of the leaf spring pieces from the edge, and fixed to the fixing member, and
    the slits extend to the fixing member.

3. The laser chamber apparatus according to claim 1, wherein
    the slits are provided between the bar members, and the leaf spring pieces are configured to individually press the bar members.

4. The laser chamber apparatus according to claim 1, wherein
    a longitudinal direction of the slits is perpendicular to the edge.

5. The laser chamber apparatus according to claim 1, wherein
    the edges of the leaf spring pieces of the leaf spring are configured to press the bar members.

6. The laser chamber apparatus according to claim 1, wherein
    the bar members each have a first section connected to the contact plate and extending in a direction away from the pipe in a plane direction perpendicular to the longitudinal direction of the pipe, a bent section connected to the first section and bent, and a second section connected to the bent section of the bar members, and
    the leaf spring is configured to press the bent sections of the bar members.

7. The laser chamber apparatus according to claim 6, wherein
    principal surfaces of the leaf spring pieces of the leaf spring are configured to press the bent sections of the bar members.

8. The laser chamber apparatus according to claim 7, wherein
    the leaf spring pieces and the bar members, each individually pressed by the leaf spring pieces, are separate from each other in the bent sections of the leaf spring pieces.

9. The laser chamber apparatus according to claim 8, wherein
    the bent sections of the leaf spring pieces are each convex on the opposite side to the respective bar members.

10. The laser chamber apparatus according to claim 1, wherein
the leaf spring has a laminate structure in which a plurality of metal plates are stacked on each other.

11. The laser chamber apparatus according to claim 10, wherein
a difference in thickness between the leaf spring and the outer electrode is equal to or smaller than a thickness of each of the metal plates.

12. The laser chamber apparatus according to claim 1, wherein
the outer electrode is made of copper, and
the leaf spring is made of brass.

13. The laser chamber apparatus according to claim 1, wherein
a width of each of the slits is greater than or equal to 1 mm but smaller than or equal to 10 mm.

14. The laser chamber apparatus according to claim 1, wherein
each of the leaf spring pieces is in contact with and press the respective bar members, and the bent sections of the leaf spring pieces are separated by the respective slits.

15. A gas laser apparatus comprising a laser chamber apparatus,
the laser chamber apparatus including
a dielectric pipe,
an inner electrode disposed in a through hole in the pipe,
an outer electrode including a contact plate extending along a longitudinal direction of the pipe and being in contact with an outer circumferential surface of the pipe and a ladder section formed of a plurality of bar members each having one end connected to the contact plate and juxtaposed along a longitudinal direction of the contact plate, and
a leaf spring extending along the longitudinal direction of the pipe, being a separate member from the outer electrode, and configured to contact with the outer electrode and to press the outer electrode against the pipe,
the leaf spring including a plurality of leaf spring pieces separated by slits resulting from cutting of the leaf spring from an edge thereof along the longitudinal direction of the pipe, and
the leaf spring pieces each including a bent section bent along the edge and are configured to contact with the bar members in a position shifted from the bent sections toward the edge and to press the bar members.

16. The gas laser apparatus according to claim 15, further comprising
a fixing member extending along the longitudinal direction of the pipe and configured to press and fix the outer electrode and the leaf spring, wherein
the outer electrode includes a fixing plate extending along the longitudinal direction of the pipe, connected to another end of each of the bar members, and fixed to the fixing member,
the leaf spring includes a fixing portion extending along the longitudinal direction of the pipe, connected to an opposite side of the leaf spring pieces from the edge, and fixed to the fixing member, and
the slits extend to the fixing member.

17. The gas laser apparatus according to claim 15, wherein
the slits are provided between the bar members, and the leaf spring pieces are configured to individually press the bar members.

18. The gas laser apparatus according to claim 15, wherein
a longitudinal direction of the slits is perpendicular to the edge.

19. The gas laser apparatus according to claim 15, wherein
the edges of the leaf spring pieces of the leaf spring are configured to press the bar members.

20. The gas laser apparatus according to claim 15, wherein
the bar members each have a first section connected to the contact plate and extending in a direction away from the pipe in a plane direction perpendicular to the longitudinal direction of the pipe, a bent section connected to the first section and bent, and a second section connected to the bent section of the bar members, and
the leaf spring is configured to press the bent sections of the bar members.

21. The gas laser apparatus according to claim 20, wherein
principal surfaces of the leaf spring pieces of the leaf spring are configured to press the bent sections of the bar members.

22. The gas laser apparatus according to claim 21, wherein
the leaf spring pieces and the bar members, each individually pressed by the leaf spring pieces, are separate from each other in the bent sections of the leaf spring pieces.

23. The gas laser apparatus according to claim 22, wherein
the bent sections of the leaf spring pieces are each convex on the opposite side to the respective bar members.

24. The gas laser apparatus according to claim 15, wherein the leaf spring has a laminate structure in which a plurality of metal plates are stacked on each other.

25. A method for manufacturing an electronic device, the method comprising:
generating laser light in a gas laser apparatus including a laser chamber apparatus;
outputting the laser light to an exposure apparatus; and
exposing a light sensitive substrate to the laser light in the exposure apparatus to manufacture the electronic device,
the laser chamber apparatus including
a dielectric pipe,
an inner electrode disposed in a through hole in the pipe,
an outer electrode including a contact plate extending along a longitudinal direction of the pipe and being in contact with an outer circumferential surface of the pipe and a ladder section formed of a plurality of bar members each having one end connected to the contact plate and juxtaposed along a longitudinal direction of the contact plate, and
a leaf spring extending along the longitudinal direction of the pipe, being a separate member from the outer electrode, and configured to contact with the outer electrode and to press the outer electrode against the pipe,
the leaf spring including a plurality of leaf spring pieces separated by slits resulting from cutting of the leaf spring from an edge thereof along the longitudinal direction of the pipe, and
the leaf spring pieces each including a bent section bent along the edge and are configured to contact with the bar members in a position shifted from the bent sections toward the edge and to press the bar members.

26. The method according to claim 25, wherein
the bar members each have a first section connected to the contact plate and extending in a direction away from the pipe in a plane direction perpendicular to the longitudinal direction of the pipe, a bent section connected to the first section and bent, and a second section connected to the bent section of the bar members, and
the leaf spring is configured to press the bent sections of the bar members.

27. The method according to claim 26, wherein
principal surfaces of the leaf spring pieces of the leaf spring are configured to press the bent sections of the bar members.

28. The method according to claim 27, wherein
the leaf spring pieces and the bar members, each individually pressed by the leaf spring pieces, are separate from each other in the bent sections of the leaf spring pieces.

29. The method according to claim 28, wherein
the bent sections of the leaf spring pieces are each convex on the opposite side to the respective bar members.

\* \* \* \* \*